(12) United States Patent
Yoshizawa et al.

(10) Patent No.: US 7,372,157 B2
(45) Date of Patent: May 13, 2008

(54) SEMICONDUCTOR DEVICE INCLUDING TITANIUM WIRES AND MANUFACTURING METHOD THEREFOR

(75) Inventors: Kazutaka Yoshizawa, Kawasaki (JP); Shinichiroh Ikemasu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/079,591

(22) Filed: Feb. 22, 2002

(65) Prior Publication Data
US 2003/0089993 A1 May 15, 2003

(30) Foreign Application Priority Data
Nov. 14, 2001 (JP) .............................. 2001-349048

(51) Int. Cl.
*H01L 23/48* (2006.01)
*H01L 23/52* (2006.01)
*H01L 29/40* (2006.01)

(52) U.S. Cl. ........................................ 257/760; 257/763

(58) Field of Classification Search ................ 257/763, 257/764, 760, 750, 751, 758, 783
See application file for complete search history.

(56) References Cited

U.S. PATENT DOCUMENTS

| | | | | |
|---|---|---|---|---|
| 4,517,729 A | * | 5/1985 | Batra | .......................... 438/287 |
| 5,372,969 A | * | 12/1994 | Moslehi | ........................ 438/106 |
| 5,612,254 A | * | 3/1997 | Mu et al. | ...................... 438/634 |
| 5,612,557 A | * | 3/1997 | Kondo et al. | ................ 257/288 |
| 5,739,579 A | * | 4/1998 | Chiang et al. | ............... 257/635 |
| 6,028,360 A | * | 2/2000 | Nakamura et al. | |
| 6,383,870 B2 | * | 5/2002 | San et al. | .................... 438/257 |
| 6,440,807 B1 | * | 8/2002 | Ajmera et al. | ............... 438/300 |
| 6,479,873 B1 | * | 11/2002 | Yoshiyama et al. | .......... 257/382 |
| 2004/0094793 A1 | * | 5/2004 | Noguchi et al. | ............. 257/315 |

FOREIGN PATENT DOCUMENTS

| JP | 11-87652 | | 3/1999 |
|---|---|---|---|
| JP | 11-87652 | A | 3/1999 |

* cited by examiner

*Primary Examiner*—S. V. Clark
(74) *Attorney, Agent, or Firm*—Westerman, Hattori, Daniels & Adrian, LLP.

(57) ABSTRACT

A first insulating film consisting of an insulating material is formed on a major surface of a semiconductor substrate. On the first insulating film, a wire comprising a first conductive layer, which contains one of elemental Ti and a Ti compound, is formed. Cover films consisting of silicon nitride cover the upper surface, the bottom surface, and the side surfaces of the wire having a multilayer structure. Accordingly, a semiconductor device in which insulation defects are unlikely to occur even when the degree of integration is increased can be provided.

13 Claims, 11 Drawing Sheets

SEMICONDUCTOR DEVICE INCLUDING TITANIUM WIRES AND MANUFACTURING METHOD THEREFOR

BACKGROUND OF THE INVENTION

1. Field of the Invention

The present invention relates to semiconductor devices and manufacturing methods therefor, and more particularly, relates to a semiconductor device including wires consisting of elemental titanium (Ti) or a Ti-containing conductive material and to a manufacturing method therefor.

2. Description of the Related Art

A conventional method for manufacturing a multilayer wiring structure including Ti layers will be described with reference to FIGS. 3A to 3F.

As shown in FIG. 3A, a first interlayer insulating film 200, which is formed of borophosphosilicate glass (BPSG) and provided on a surface of a silicon substrate, is planarized by chemical mechanical polishing (CMP). On the surface of the first interlayer insulating film 200 thus planarized, a second interlayer insulating film 201 of 100 nm thick consisting of silicon oxide is formed by chemical vapor deposition (CVD).

As shown in FIG. 3B, on the second interlayer insulating film 201, a Ti film 202 having a thickness of 40 nm, a titanium nitride (TiN) film 203 having a thickness of 20 nm, and tungsten (W) film 204 having a thickness of 100 nm are deposited in that order. In addition, on the W film 204, an antireflection film 205 formed of SiON is deposited.

As shown in FIG. 3C, a resist pattern 206 is formed on the antireflection film 205. The resist pattern 206 covers areas at which wires are to be formed. Etching from the antireflection film 205 to the Ti film 202 is performed by using the resist pattern 206 as a mask. After etching, the resist pattern 206 is removed.

As shown in FIG. 3D, multilayer wires 207 each consisting of the Ti film 202, the TiN film 203, and the W film 204 are formed.

As shown in FIG. 3E, a third interlayer insulating film 208 of 10 to 20 nm thick consisting of silicon nitride is formed by low pressure CVD so as to cover the exposed surface of the second interlayer insulating film 201 and the multilayer wires 207.

As shown in FIG. 3F, on the third interlayer insulating film 208, a fourth interlayer insulating film 209 of 700 nm thick consisting of silicon oxide is formed by high density plasma CVD. On the fourth interlayer insulating film 209, a fifth interlayer insulating film 210 of 350 nm thick consisting of silicon nitride is formed by plasma enhanced CVD. The bottom of the multilayer wire 207 is in contact with the second interlayer insulating film 201, and the side surfaces and the upper surface of the multilayer wire 207 are in contact with the third interlayer insulating film 208, so that the multilayer wire 207 is insulated from the other conductive regions.

However, when the degree of integration of a semiconductor integrated circuit device is increased, it was found that insulation defects between wires or between a wire and another conductive plug were likely to occur.

SUMMARY OF THE INVENTION

Accordingly, an object of the present invention is to provide a semiconductor device in which insulation defects are unlikely to occur even when the degree of integration is increased, and is to provide a manufacturing method therefor.

In accordance with one aspect of the present invention, there is provided a semiconductor device comprising: a first insulating film provided on a principal surface of a semiconductor substrate; a wire formed on the first insulating film and comprising a first conductive layer consisting of titanium or titanium compound; and a cover film consisting of silicon nitride and covering an upper surface, a bottom surface, and a side surface of the wire.

In accordance with another aspect of the present invention, there is provided a method for manufacturing a semiconductor device comprising the steps of: forming a first insulating film on a principal surface of a semiconductor substrate provided with a semiconductor element so as to cover the semiconductor element; forming a first cover film consisting of silicon nitride on the surface of the first insulating film; forming a wire on the surface of the cover film, the wire comprising a first conductive layer consisting of titanium or titanium compound; and forming a second cover film consisting of silicon nitride so as to cover an upper surface and a side surface of the wire.

The cover films prevent the diffusion of elemental Ti contained in the first conductive layer. Accordingly, the insulation defects caused by the diffusion of elemental Ti can be prevented.

DETAILED DESCRIPTION OF THE PREFERRED EMBODIMENTS

Before describing embodiments of the present invention, the reason for the generation of insulation defects, which is newly discovered by the inventors of the present invention, will be described.

Figure 4:
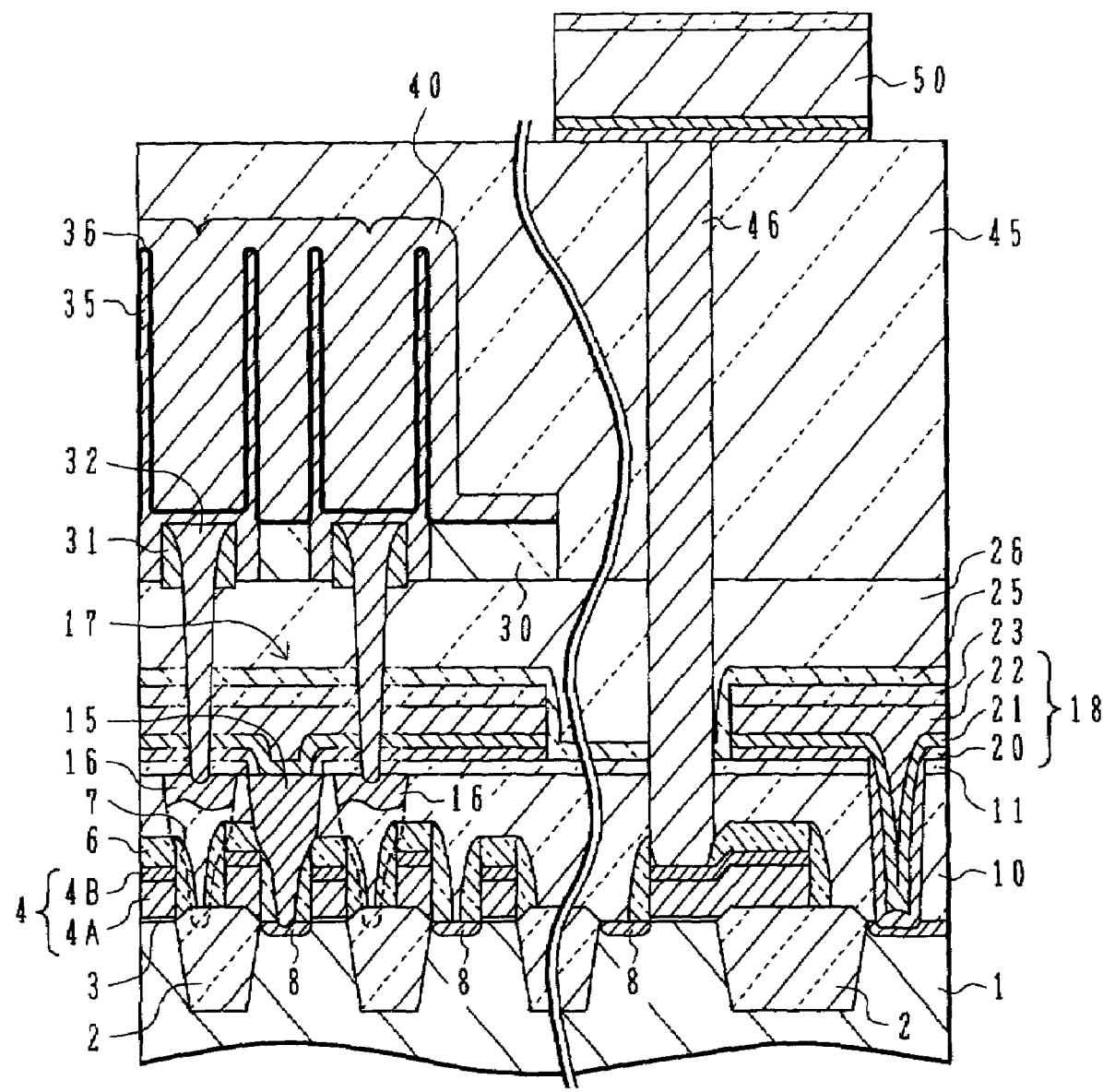
FIGS. 4 and 5 each show a cross-sectional view of a DRAM in which an insulation defect occurs.

FIG. 4 shows a cross-sectional view of a dynamic random access memory (DRAM) in which an insulation defect occurs. A cross-sectional view of a memory cell area is shown at the left of FIG. 4, and a cross-sectional view of a peripheral circuit area is shown at the right. Element separation regions 2 are formed on the surface of a substrate 1 consisting of silicon, and hence, active regions are defined.

A MOS field effect transistor (MOSFET) is formed in each active region. The MOSFET is consisting of a gate insulating film 3, a gate electrode 4, and a pair of dopant diffusion regions 8 which are used as a source region and a drain region. In FIG. 4, one of the pair of dopant diffusion regions 8 of the MOSFET is only shown, and the other dopant diffusion region is disposed at the front side or the rear side of this cross-section shown in the figure. The gate electrode 4 has a two-layered structure consisting of a polycrystalline silicon film 4A and a tungsten silicide (WSi)

film 4B. On the gate electrode 4, an upper protection film 6 consisting of silicon nitride is disposed. Side surface protection films 7 consisting of silicon nitride are formed over side surfaces of the gate insulating film 3, the gate electrode 4, and the upper protection film 6. The gate electrodes 4 extend in the direction perpendicular to the plane of the figure and form word lines. A first interlayer insulating film 10 of 1 μm thick consisting of BPSG is formed over the substrate 1 so as to cover the MOSFET's. The surface of the first interlayer insulating film 10 is planarized in a reflow step and a CMP step. On the surface thus planarized, a second interlayer insulating film 11 of 100 nm thick consisting of silicon oxide is formed by CVD. In the memory cell area, a via hole penetrating through the first interlayer insulating film 10 is formed at a position corresponding to one of the pair of dopant diffusion regions 8 of each MOSFET. Polycrystalline silicon is filled in this via hole to form a first conductive plug 15.

A via hole is also formed at a position corresponding to the other dopant diffusion region 8 of the MOSFET. Polycrystalline silicon is filled in this via hole to form a second conductive plug 16. The second conductive plug 16 is not actually present in the cross-section shown in FIG. 4; however, for the convenience of illustration of wires which are subsequently formed, the conductive plug 16 is shown by a dotted line in a surface layer of the first interlayer insulating film 10.

On the second interlayer insulating film 11, a bit line 17 is disposed in the memory cell area, and a wire 18 is disposed in the peripheral circuit area. Both the bit line 17 and the wire 18 each have a three-layered structure consisting of a Ti layer 20 having a thickness of 40 nm, a TiN layer 21 having a thickness of 20 nm, and a W layer 22 having a thickness of 100 nm, which are laminated to each other in this order. The bit line 17 is in contact with the first conductive plug 15 via an opening formed in the second interlayer insulating film 11. The wire 18 is in contact with the dopant diffusion region 8 formed in the surface layer of the substrate 1 through a via hole penetrating through the first interlayer insulating film 10 and the second interlayer insulating film 11.

A cover film 25 of 10 to 20 nm thick consisting of silicon nitride is formed so as to cover the bit line 17 and the wire 18. A third interlayer insulating film 26 of 350 nm thick consisting of silicon oxide is formed on the cover film 25. The surface of the third interlayer insulating film 26 is planarized by CMP.

A via hole penetrating through the third interlayer insulating film 26 is formed at a position corresponding to the second conductive plug 16. Doped amorphous silicon is filled in this via hole to form a third conductive plug 32. The bottom of the third conductive plug 32 is in contact with the second conductive plug 16, and the top of the third conductive plug 32 protrudes slightly from the upper surface of the third interlayer insulating film 26. This protruding portion becomes thicker, as a position thereof goes far away from the third interlayer insulating film 26, and a sidewall spacer 31 consisting of doped amorphous silicon is formed on the side surface of the protruding portion. The external periphery of the sidewall spacer 31 is approximately perpendicular to the upper surface of the third interlayer insulating film 26.

A fourth interlayer insulating film 30 of 150 nm thick consisting of silicon nitride is formed on the surface of the third interlayer insulating film 26 in the memory cell area. The fourth interlayer insulating film 30 has an opening at a position corresponding to the third conductive plug 32. The inner side surface of this opening faces the outer side surface of the sidewall spacer 31 with a certain gap therebetween. The upper surface of the fourth interlayer insulating film 30 is flush with the upper surface of the third conductive plug 32.

A cylinder-shaped electrode 35 corresponding to each third conductive plug 32 is disposed. The cylinder-shaped electrode 35 is composed of a portion which fills the gap between the fourth interlayer insulating film 30 and the sidewall spacer 31, a portion which covers the upper surface of the third conductive plug 32, and a cylindrical portion along a cylindrical surface which is hypothetically formed by upwardly extending the outer side surface of the sidewall spacer 31.

A dielectric film 36 for forming capacitors is formed so as to cover the surfaces of the cylinder-shaped electrodes 35. The dielectric film 36 has a two-layered structure composed of a silicon nitride film and a silicon oxide film. In addition, the dielectric film 36 also covers the upper surface of the fourth interlayer insulating film 30. On the dielectric film 36, a plate electrode 40 of 100 nm thick consisting of doped amorphous silicon is formed.

On the plate electrode 40 in the memory cell area and the third interlayer insulating film 26 in the peripheral circuit area, a fifth interlayer insulating film 45 consisting of silicon oxide is formed. The surface of the fifth interlayer insulating film 45 is planarized by CMP.

A via hole penetrating from the fifth interlayer insulating film 45 to the upper protection film 6 is formed at a position corresponding to the gate electrode 4 in the peripheral circuit area. Tungsten is filled in this via hole to form a fourth conductive plug 46. The fourth conductive plug 46 is in contact with the gate electrode 4 in the peripheral circuit area.

On the fifth interlayer insulating film 45, an upper layer wire 50 in contact with the fourth conductive plug 46 is formed. The fourth conductive plug 46 passes through the vicinity (at the side) of the wire 18 in the direction of the substrate thickness.

When the DRAM shown in FIG. 4 was tested, it was found that the insulation defect was likely to occur between the wire 18 and the fourth conductive plug 46. In addition, it was found that when a further detailed inspection was carried out, elemental Ti in the Ti layer 20 and the TiN layer 21, which formed the wire 18, diffused widely in the first interlayer insulating film 10 formed of BPSG and reached the fourth conductive plug 46.

Figure 5:
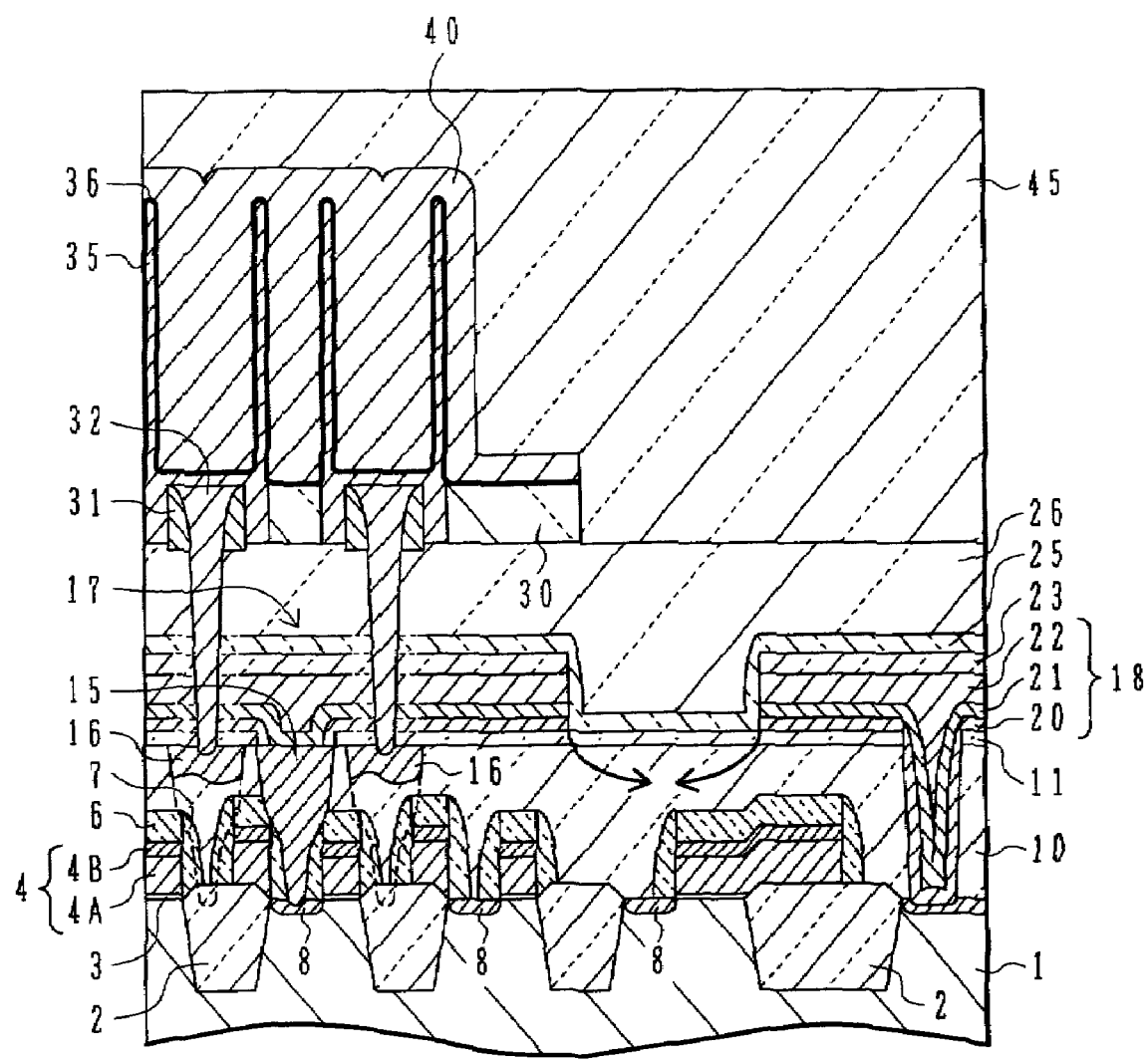

As shown in FIG. 5, the wires, which are formed on the second interlayer insulating film 11 and are adjacent to each other, may be short-circuited by the diffusion of elemental Ti in some cases.

According to detailed evaluation conducted by the inventors of the present invention, it was found that the presence of the fourth interlayer insulating film 30 consisting of silicon nitride caused the diffusion of elemental Ti. A silicon nitride film generally has an internal tensile stress. When plasma enhanced CVD is used as a film-forming method, a silicon nitride film is only formed on one surface of the substrate. When a silicon nitride film is only formed on one surface, the substrate warps, and as a result, strain is generated in every thin film formed on the substrate. It is considered that the strains described above cause the diffusion of elemental Ti. According to embodiments described below, the diffusion of elemental Ti can be prevented.

Figure 1:
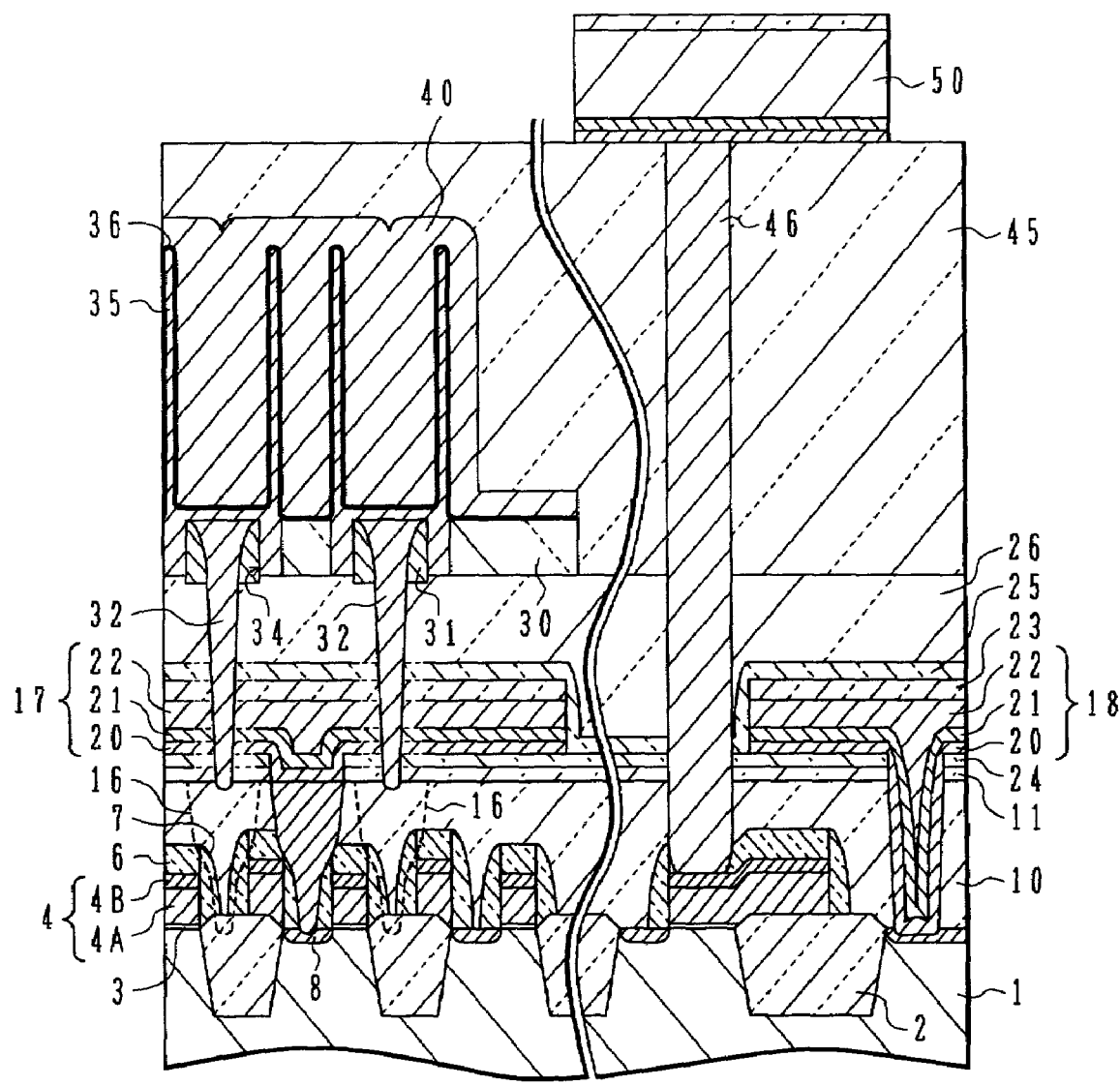
FIG. 1 is a cross-sectional view of a dynamic random access memory (DRAM) according to an embodiment of the present invention.

FIG. 1 shows a cross-sectional view of a DRAM according to an embodiment of the present invention. Hereinafter, the difference in the structure of this DRAM from that shown in FIG. 4 will be described. The DRAM shown in FIG. 4 has the Ti layer 20 which is directly formed on the second interlayer insulating film 11 consisting of silicon oxide. According to the DRAM according to the embodiment shown in FIG. 1, a lower cover film 24 of 10 to 20 nm thick consisting of silicon nitride is disposed between the second interlayer insulating film 11 and the Ti layer 20. Accordingly, the entire surfaces of the wire 18 and the bit line 17 are covered by at least one of the lower cover film 24 and the upper cover film 25.

The lower cover film 24 and the upper cover film 25 prevent the diffusion of elemental Ti contained in the Ti layer 20 and the TiN layer 21. As a result, the insulation defects caused by the diffusion of elemental Ti can be prevented. At the periphery of the via hole shown in FIG. 1 which connects the wire 18 to the dopant diffusion region 8, the first interlayer insulating film 10 consisting of BPSG and the Ti layer 20 are in contact with each other; however, the diffusion of elemental Ti in this area was not confirmed. The reason why the diffusion of elemental Ti was confirmed at the end area of the wire 18 is that it is believed that elemental Ti was likely to diffuse since a stress was concentrated at this area.

In the structure shown in FIGS. 4 and 5, it was found that when elemental Ti penetrated through the second interlayer insulating film 11 and reached the first interlayer insulating film 10 consisting of BPSG provided thereunder, the elemental Ti diffused more widely. Accordingly, in the case in which a film consisting of BPSG is disposed under the wire 18, the advantage can be more particularly obtained by using the structure of the embodiment described above. When phosphosilicate glass (PSG) or borosilicate glass (BSG) is used for forming a film in place of BPSG, the same advantage as described above can also be obtained.

Next, referring to FIGS. 2A to 2L, a method for manufacturing the DRAM according to the embodiment of the present invention will be described.

Figure 2A:
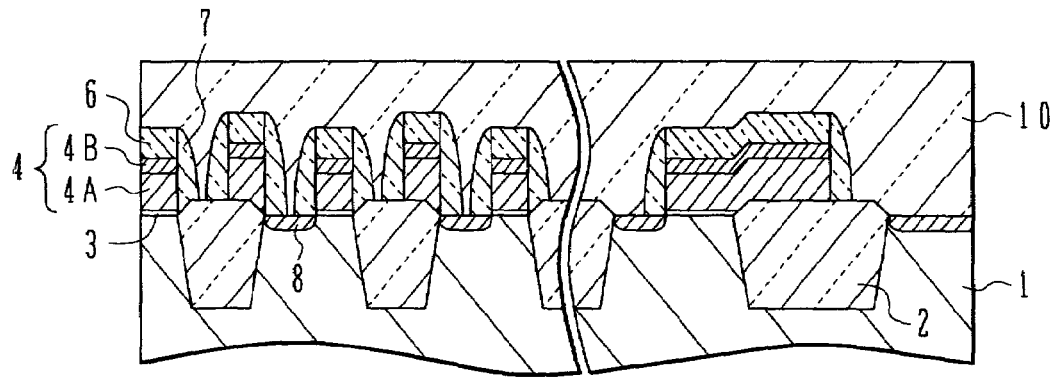
FIGS. 2A to 2L each show a cross-sectional view of a substrate for illustrating a method for manufacturing a DRAM according to an embodiment of the present invention.

Steps for obtaining a DRAM in the state shown in FIG. 2A will be described. On the surface of the silicon substrate 1, element separation regions 2 consisting of silicon oxide are formed by a shallow trench isolation (STI) process. Active regions are defined by the element separation regions 2. Ion implantation is performed for forming wells and channel stopper regions, and the gate insulating film 3 is formed on a surface of each active region by thermal oxidation.

On the gate insulating film 3 and the element separation region 2, the polycrystalline silicon layer 4A and the WSi layer 4B are deposited in this order. On the WSi layer 4B, the upper protection film 6 consisting of silicon nitride is deposited. The gate electrode 4 is formed by patterning the three layers, that is, the upper protection film 6, the WSi layer 4B, and the polycrystalline silicon layer 4A.

Ion implantation is performed for forming the source and the drain regions by using the gate electrode 4 as a mask. On the side surfaces of the gate electrode 4 and the upper protection film 6, sidewall protection films 7 consisting of silicon nitride are formed. The sidewall protection films 7 are formed by anisotropic etching of a silicon nitride film, after the silicon nitride film is deposited over the entire surface of the substrate.

The first interlayer insulating film 10 of 1 μm thick consisting of BPSG is deposited over the substrate so as to cover the upper protection film 6 and the sidewall protection films 7. The surface of the first interlayer insulating film 10 is planarized by performing a reflow and a CMP step.

Figure 2B:
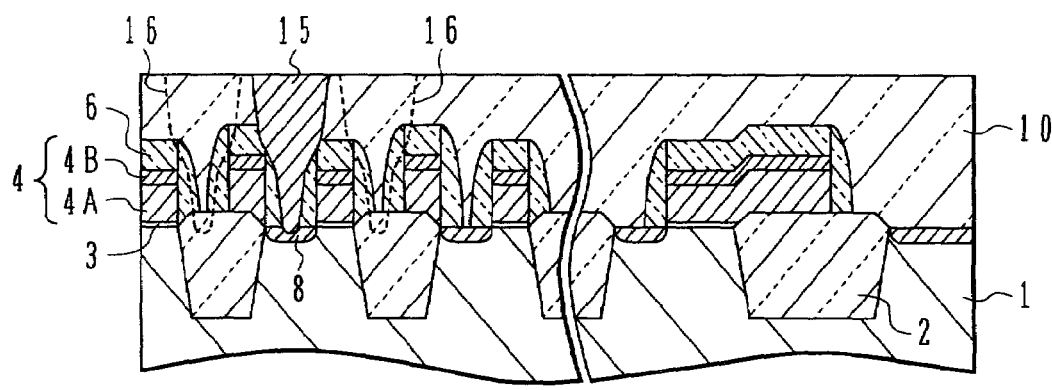

As shown in FIG. 2B, via holes penetrating through the first interlayer insulating film 10 are formed at positions corresponding to the dopant diffusion regions 8 of the MOSFET in the memory cell area. Etching of the first interlayer insulating film 10 may be performed by reactive ion etching (RIE) using $C_4F_8$. Since the upper protection film 6 and the sidewall protection films 7, which cover the gate electrode 4, are not substantially etched under the conditions described above, the via holes can be formed in accordance with a self-alignment method.

Polysilicon layer is deposited using CVD so as to fill these via holes. Next, this polycrystalline silicon layer is planarized by CMP so that the upper surface of the first interlayer insulating film 10 is exposed. Accordingly, the first conductive plugs 15 and the second conductive plug 16, which are consisting of polycrystalline silicon, are formed in the via holes. The first conductive plug 15 is in contact with one of the dopant diffusion regions 8 of the MOSFET, and the second conductive plug 16 is in contact with the other dopant conductive region 8. In the cross-section shown in FIG. 2B, the first conductive plug 15 is only shown. The second conductive plug 16 located at the front or the rear side of the cross-section in FIG. 2B is shown by a dotted line.

Figure 2C:
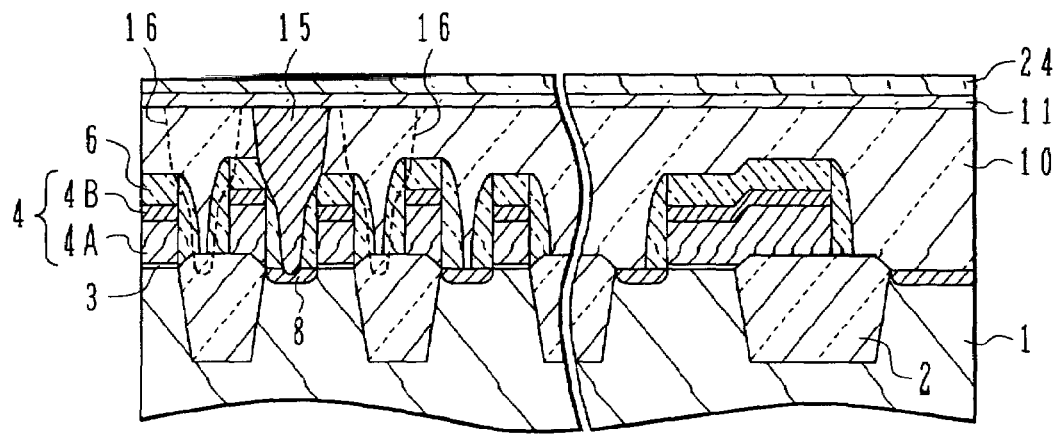

As shown in FIG. 2C, the second interlayer insulating film 11 of 100 nm thick consisting of silicon oxide is formed by CVD on the first interlayer insulating film 10, the first conductive plugs 15, and the second conductive plug 16. On the second interlayer insulating film 11, a lower cover film 24 of 10 to 20 nm thick consisting of silicon nitride is formed by low pressure CVD. In the step described above, without forming the second interlayer insulating film 11, the lower cover film 24 may be formed directly on the first interlayer insulating film 10.

Figure 2D:
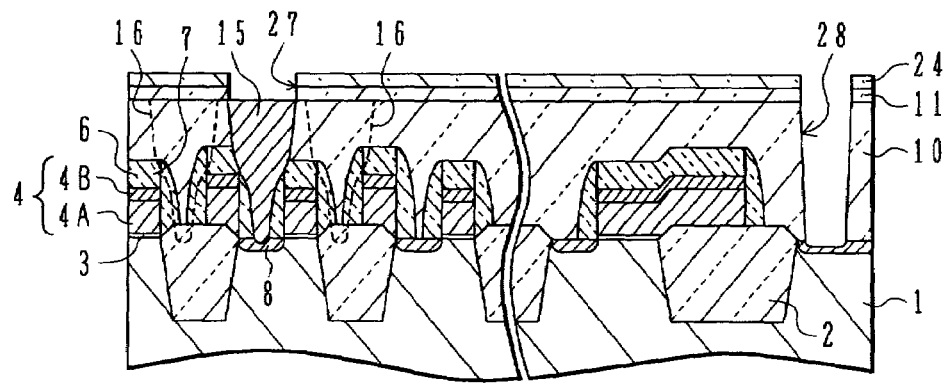

As shown in FIG. 2D, an opening 27 penetrating through two layers, that is, the lower cover film 24 and the second interlayer insulating film 11, is formed at a position corresponding to that at which the first conductive plug 15 is formed. Simultaneously, a via hole 28 is formed so as to expose the upper surface of the dopant diffusion region 8 in the peripheral circuit area.

Figure 2E:
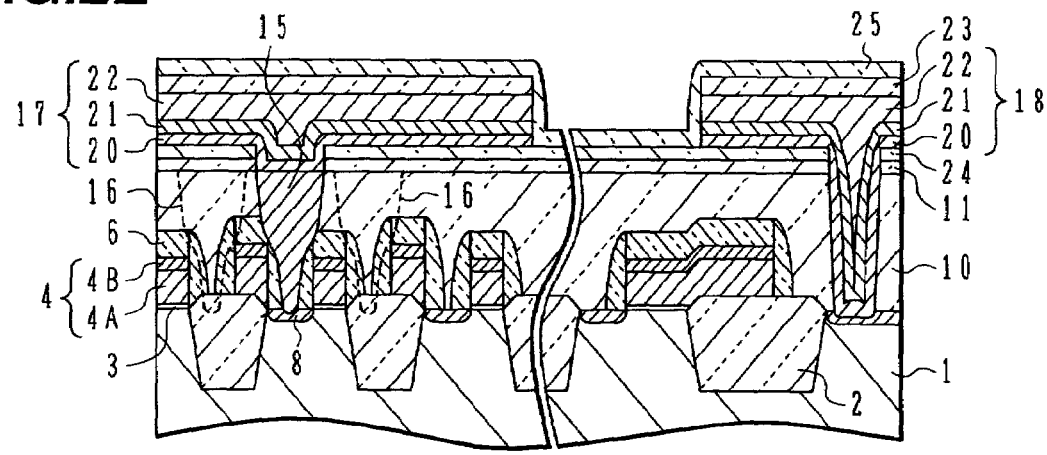

Steps for obtaining a DRAM in the state shown in FIG. 2E will be described. The Ti layer 20 having a thickness of 40 nm is formed so as to cover the surface of the lower cover film 24, the upper surface of the first conductive plug 15 which is exposed at the bottom of the opening 27, and the inner surface of the via hole 28. On the Ti layer 20, the TiN layer 21 having a thickness of 20 nm and the W layer 22 having a thickness of 100 nm are formed in this order. The Ti layer 20 may be formed by sputtering, and the TiN layer 21 and the W layer 22 may be formed by CVD. An antireflection film 23 consisting of SiON is formed on the W layer 22.

The four layers from the antireflection film 23 to the Ti Layer 20 are patterned using a chlorine-based gas so that the bit line 17 connected to the first conductive plug 15 and the wire 18 connected to the dopant diffusion region 8 in the peripheral circuit area remain. The Ti layer 20 is formed so as to ensure the electrical connection between the bit line 17 and the first conductive plug 15. The TiN layer 21 suppresses the generation of electromigration and stress migration. The lower cover film 24 may be etched so that the second interlayer insulating film 11 is exposed in an area at which the bit line 17 and the wire 18 are not formed.

An upper cover film 25 consisting of silicon nitride having a thickness of 10 to 20 nm is formed by low pressure CVD so as to cover the bit line 17, the wire 18, and the exposed lower cover film 24. Accordingly, the upper surfaces, the side surfaces, and the bottom surfaces of the bit line 17 and the wire 18 are covered with the lower cover film 24 and the upper cover film 25, which consist of silicon nitride.

In the step of forming the upper cover film 25, cover films may be formed on the side surfaces of the bit line 17 and the wire 18 using a technique for forming a sidewall spacer. In the step described above, the upper surface of the wire 18 is not covered with the cover film; however, since the Ti layer 20 is only disposed on the bottom surface of the wire 18, the effect of preventing the diffusion of elemental Ti can be expected. In addition, in a step shown in FIG. 2I described later, the upper surface of the bit line 17 is preferably covered with a silicon nitride film in order to form a via hole for forming the third conductive plug 32 in accordance with a self-aiignment method.

Figure 2F:
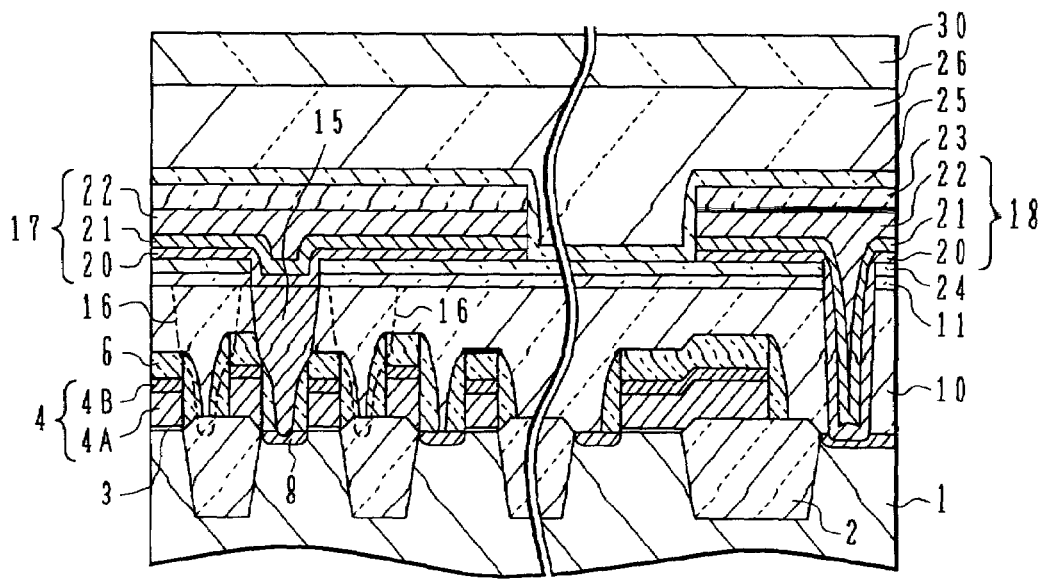

As shown in FIG. 2F, a third interlayer insulating film 26 of 1 μm thick consisting of silicon oxide is formed by CVD on the upper cover film 25. The surface of the third interlayer insulating film 26 is planarized by CMP. A fourth interlayer insulating film 30 of 350 nm thick consisting of silicon nitride is formed by plasma enhanced CVD on the third interlayer insulating film 26.

The fourth interlayer insulating film 30 consisting of silicon nitride has an internal tensile stress. When film formation is performed by plasma enhanced CVD, a thin-film is only formed on one surface of a substrate. Accordingly, compared to the case in which film formation is performed by a general CVD method which forms thin films on both sides of a substrate, the substrate is likely to warp. In addition, when silicon nitride films are formed on both surfaces of a substrate by a general CVD method, and the silicon nitride film formed on the rear side of the substrate is removed, the substrate is also likely to warp as is the case in which film formation is performed by plasma enhanced CVD.

Figure 2G:
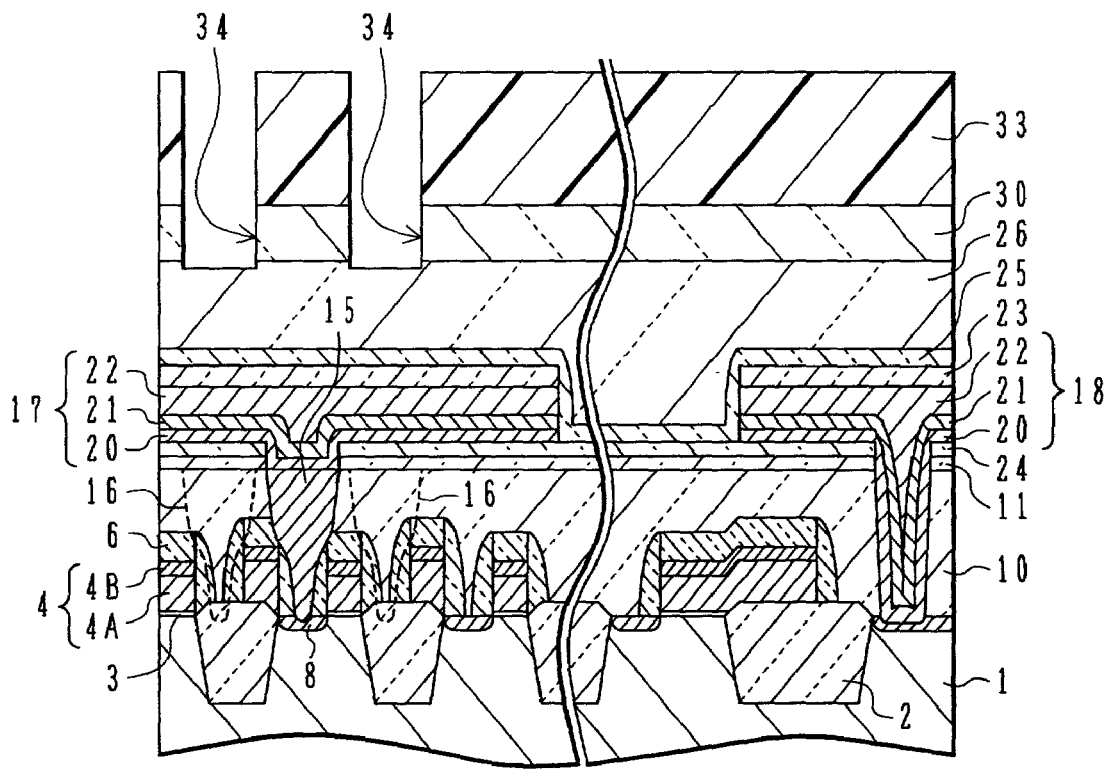

As shown in FIG. 2G, a resist pattern 33 is formed on the fourth interlayer insulating film 30. The resist pattern 33 has openings at positions corresponding to the second conductive plugs 16. The fourth interlayer insulating film 30 is etched using the resist pattern 33 as a mask, thereby forming openings 34. After the openings 34 are formed, the resist pattern 33 is removed.

Figure 2H:
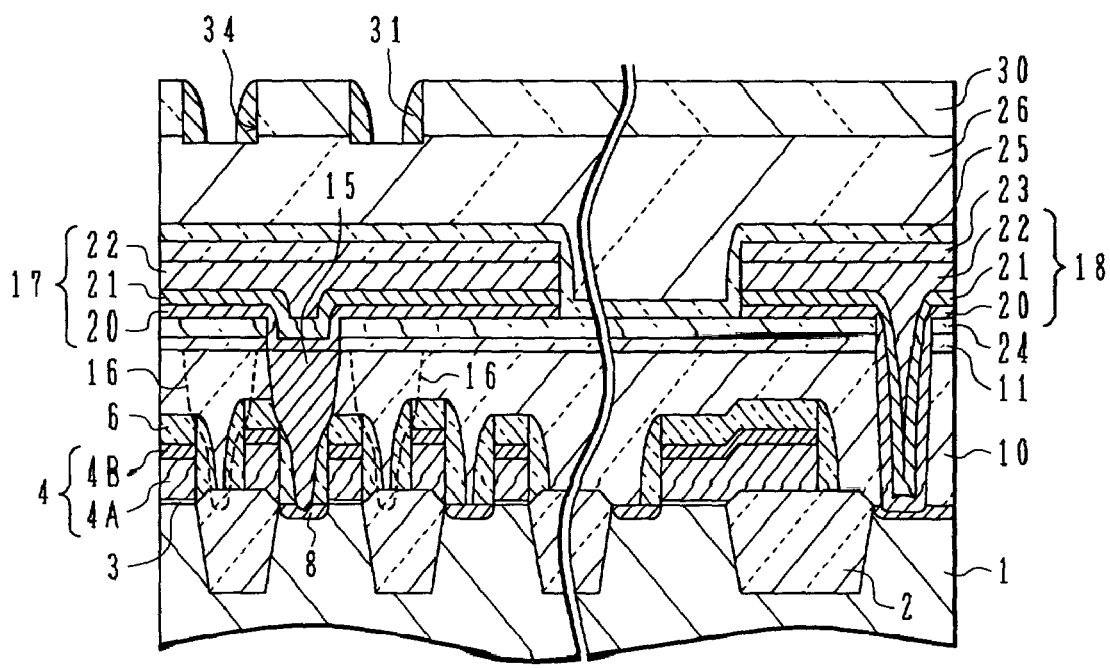

As shown in FIG. 2H, the sidewall spacer 31 consisting of doped amorphous silicon is formed on the inner side surface of each opening 34. The sidewall spacer 31 is formed by a step of forming a doped amorphous silicon film and a subsequent step of performing anisotropic etching.

Figure 2I:
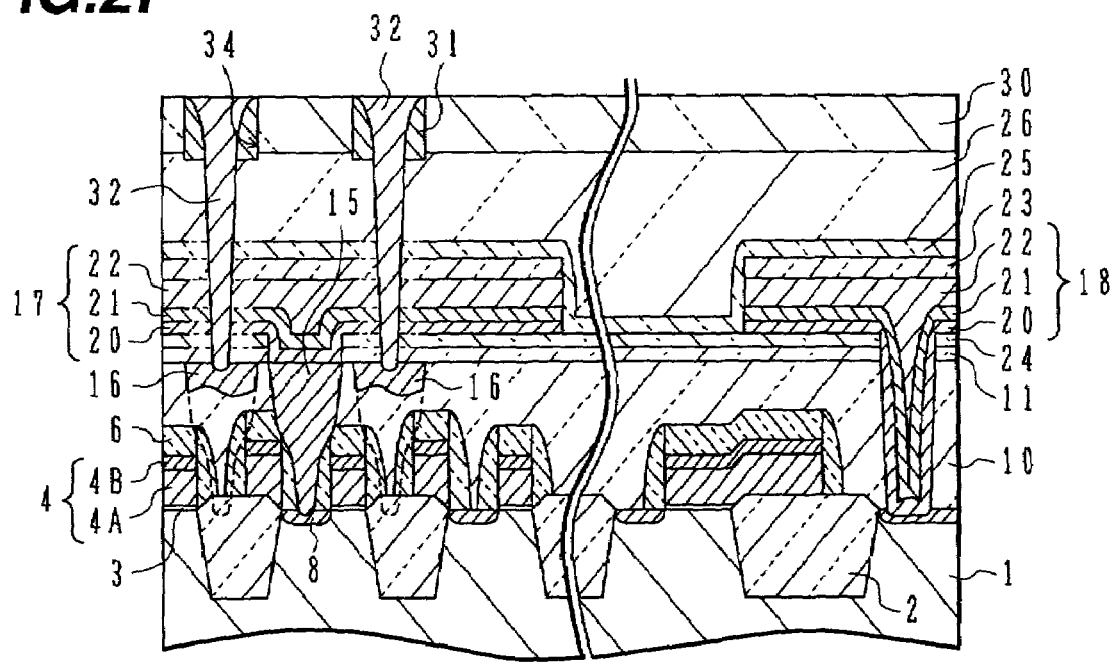

Steps for obtaining a DRAM in the state shown in FIG. 2I will be described. The third interlayer insulating film 26, the upper cover film 25, the lower cover film 24, and the second interlayer insulating film 11 are etched using the fourth interlayer insulating film 30 and the sidewall spacer 31 as a mask, thereby forming a corresponding via hole. A part of the upper surface of the second conductive plug 16 is exposed at the bottom of this via hole. In FIG. 2I, this via hole and the bit line 17 are shown in the same cross-section. However, the via hole is actually formed so as not to be in contact with the bit line 17 but is formed between the bit lines 17. By forming the sidewall spacer 31, the via hole can be thinned.

The third conductive plug 32 is formed in the via hole by filling doped amorphous silicon therein. The third conductive plug 32 is formed by a step of depositing a doped amorphous silicon film over the entire surface of the substrate and a subsequent step of performing CMP. The fourth interlayer insulating film 30 serves as a stopper film in this CMP step and also serves as an etching mask when these via holes are formed. Accordingly, it is difficult to decrease the thickness of the fourth interlayer insulating film 30, and hence, the original thickness of the fourth interlayer insulating film 30 is preferably determined so that the thickness thereof after the via holes are formed is at least 70 nm. In addition, as the fourth interlayer insulating film 30, a multilayer structure composed of insulating films each provided with an internal stress may be used, or a multilayer structure composed of insulating films provided with and without internal stresses may be used.

Figure 2J:
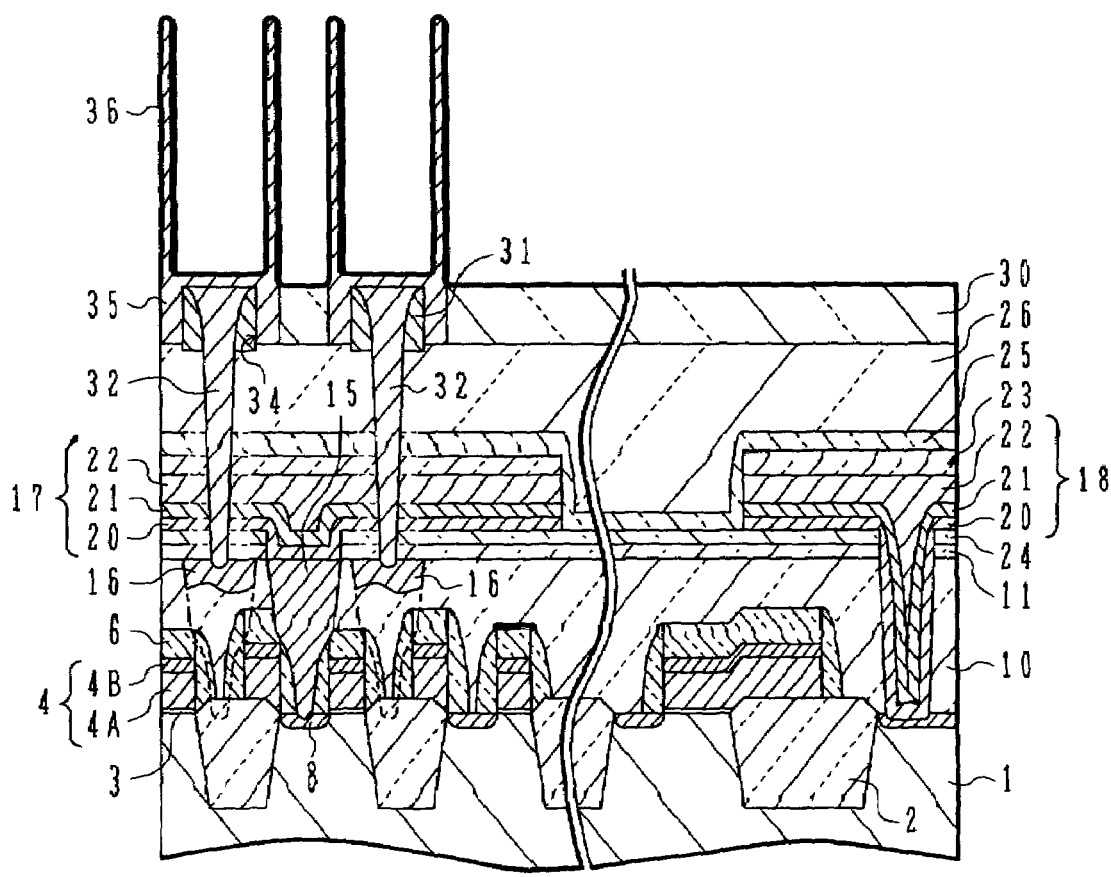

As shown in FIG. 2J, cylinder-shaped electrodes 35 are formed. Hereinafter, a method for manufacturing the cylinder electrodes 35 will be described. When the structure is in the state shown in FIG. 2I, a BPSG film of 1.0 μm thick is formed on the fourth interlayer insulating film 30 and the third conductive plug 32. Openings are formed in this BPSG film at positions corresponding to the third conductive plugs 32. The inner side surface of this opening is disposed slightly outside the outer side surface of the sidewall spacer 31. The upper surface of the third conductive plug 32 and the upper surface of the fourth interlayer insulating film 30 adjacent thereto are exposed at the bottom of the opening.

The fourth interlayer insulating film 30 exposed at the bottom of the openings is etched. As a result, the outer side surfaces of the sidewall spacers 31 are exposed. A polycrystalline silicon film, which will be formed into the cylinder-shaped electrodes, is formed by CVD on the exposed outer side surfaces of the sidewall spacers 31, the upper surfaces of the third conductive plugs 32, and the inner side surfaces of the openings in the BPSG film. A resist is applied to the polycrystalline silicon film so that the openings formed in the BPSG film are filled with the resist. CMP is performed so that the upper surface of the BPSG film is exposed. Accordingly, the polycrystalline silicon film formed on the inner surfaces of the openings in the BPSG film is divided into the cylinder-shaped electrodes 35. After the resist is removed by ashing, the BPSG film is removed by etching. By the steps described above, the cylinder-shaped electrodes 35 are formed.

Next, on the exposed surfaces of the cylinder-shaped electrodes 35, the dielectric film 36 for forming capacitors is formed. This dielectric film 36 has a two-layered structure composed of a silicon nitride film and a silicon oxide film. The silicon nitride film is formed by CVD at a growth temperature of 650° C., and the silicon oxide film is formed by CVD at a growth temperature of 680° C.

Figure 2K:
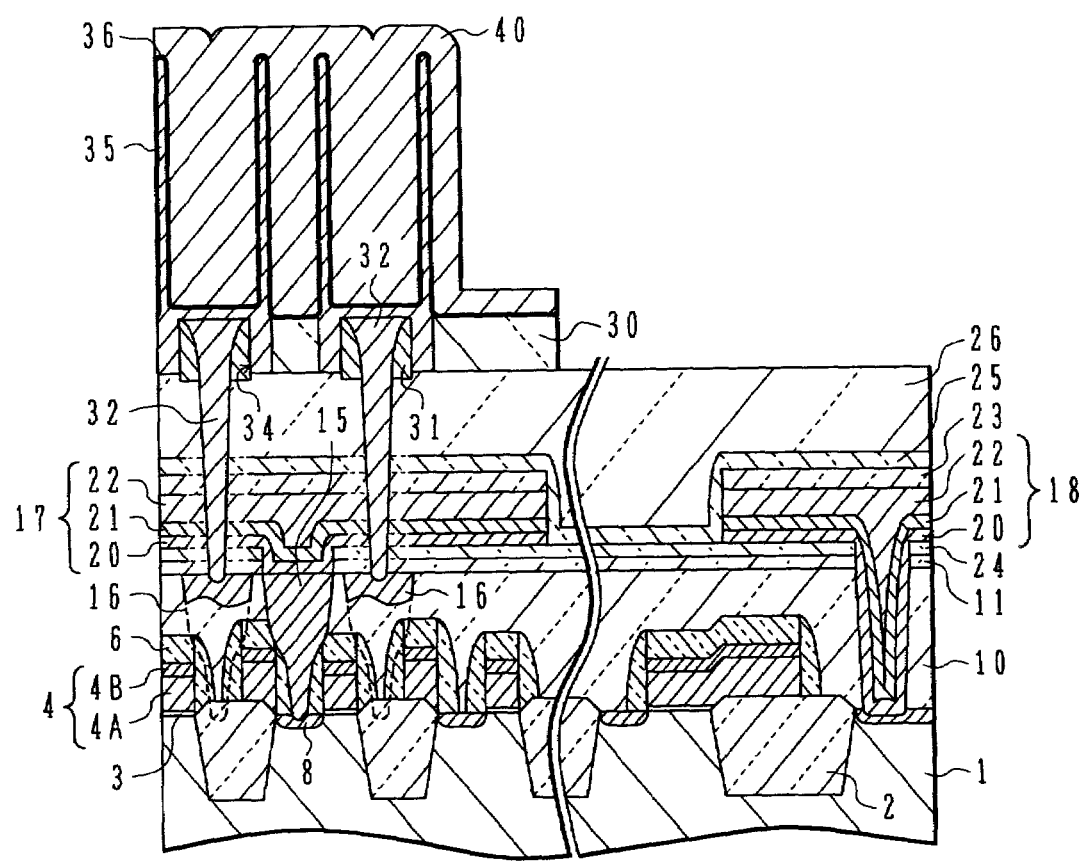

As shown in FIG. 2K, a plate electrode 40 of 100 nm thick consisting of doped amorphous silicon is formed on the exposed surface. The plate electrode 40, the dielectric film 36, and the fourth interlayer insulating film 30 in the peripheral circuit area are removed.

Figure 2L:
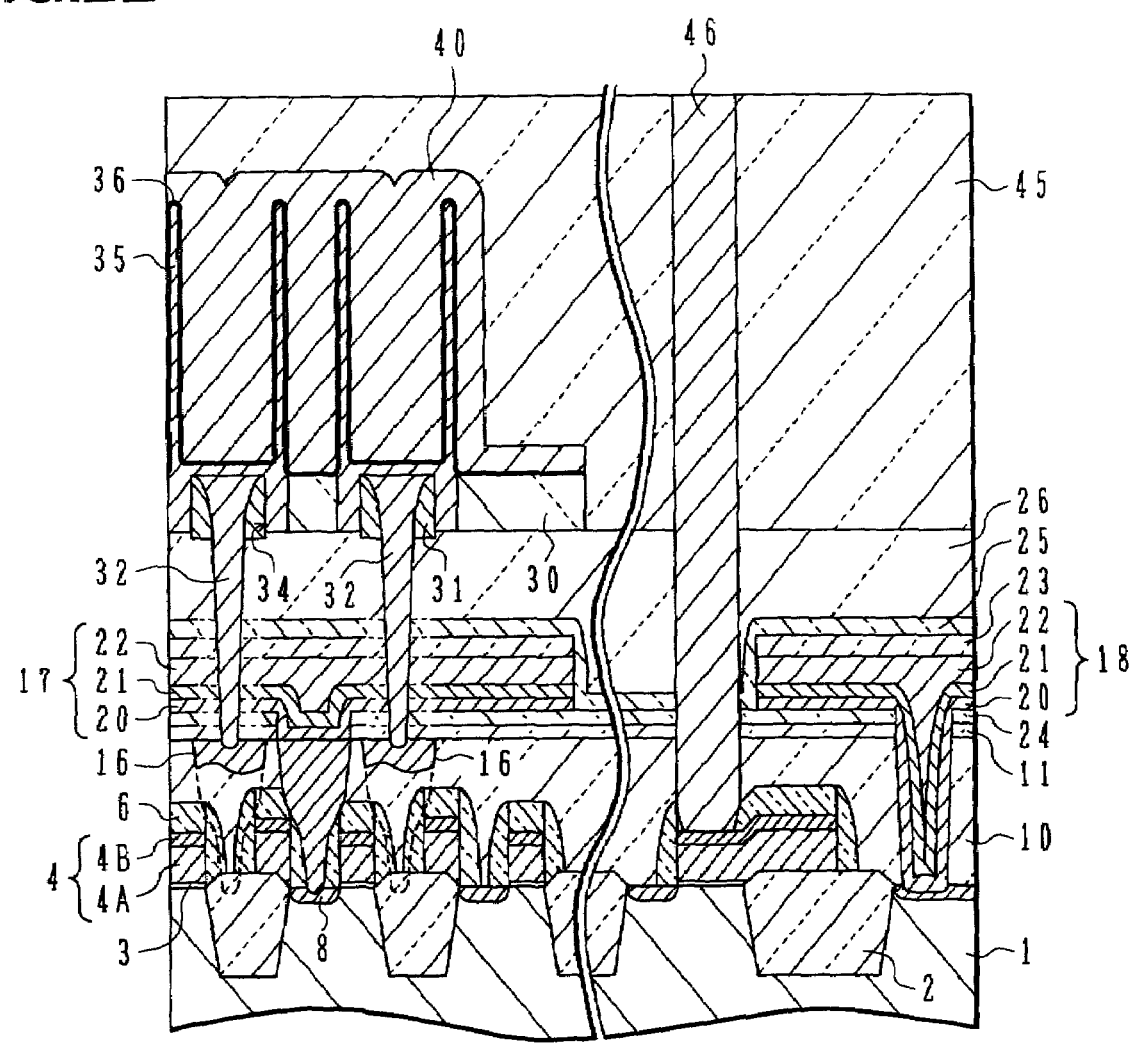
Figure 3A:
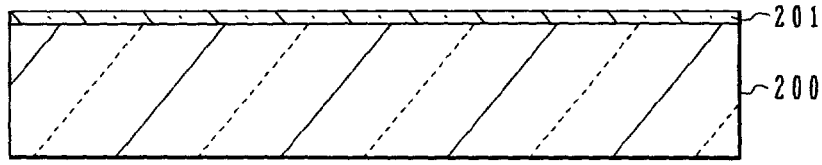
FIGS. 3A to 3F each show a cross-sectional view of a substrate for illustrating a conventional method for manufacturing wires containing a Ti layer.
Figure 3B:
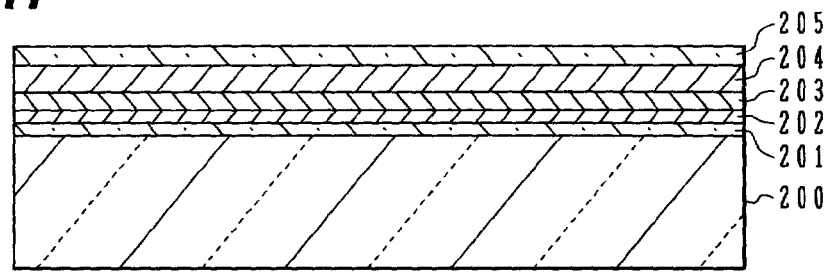
Figure 3C:
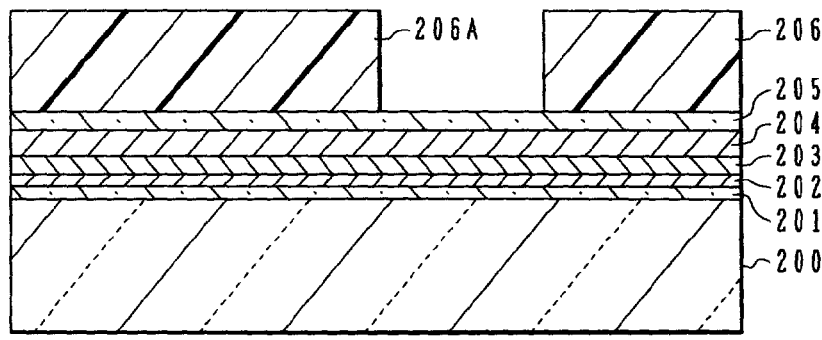
Figure 3D:
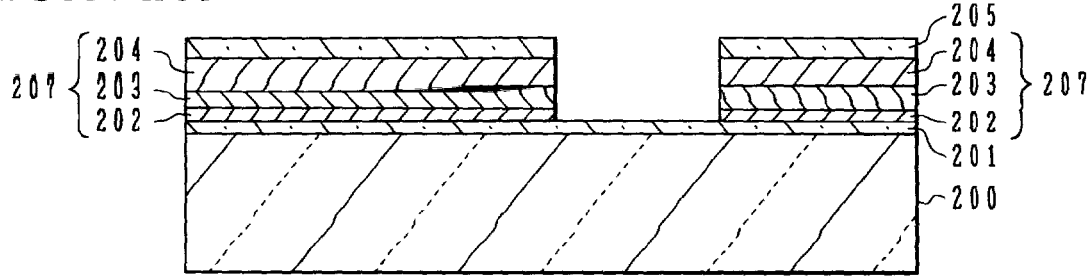
Figure 3E:
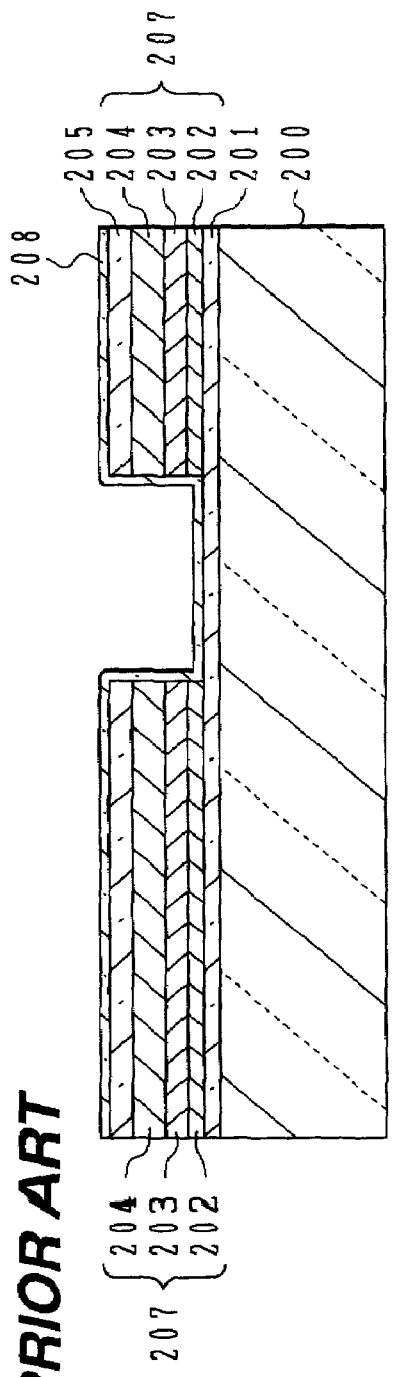
Figure 3F:
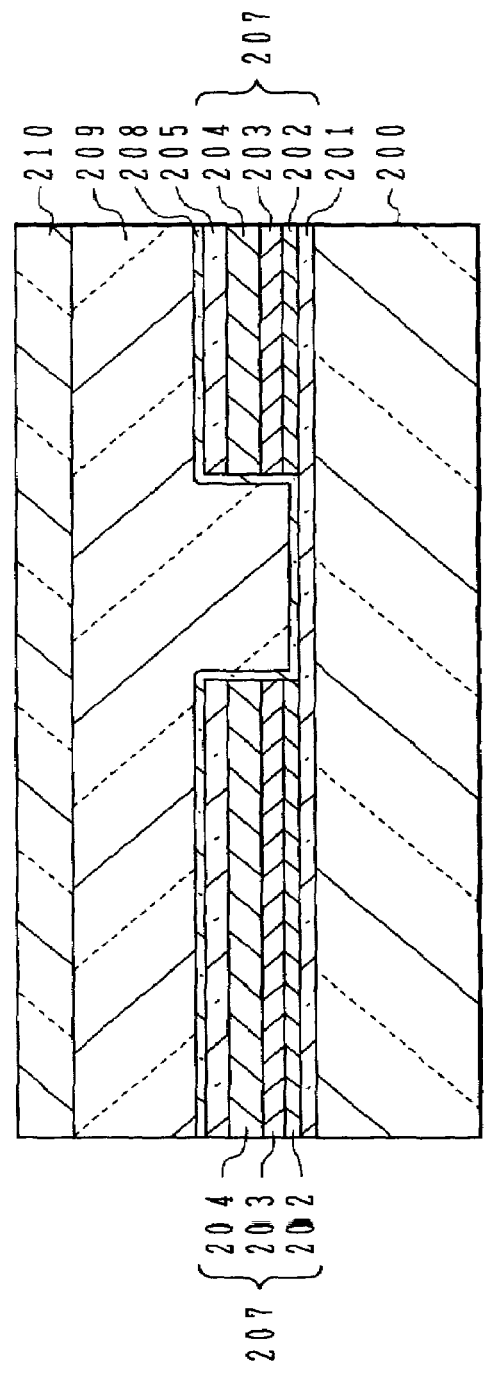

Steps for obtaining a DRAM in the state shown in FIG. 2L will be described. A fifth interlayer insulating film 45 consisting of silicon oxide is formed by CVD on the exposed surfaces. The surface of the fifth interlayer insulating film 45 is planarized by CMP. A via hole which exposes the upper surface of the gate electrode 4 in the peripheral circuit area is formed, and a fourth conductive plug 46 is formed by filling tungsten in this via hole. The inner surface of this via hole is covered with a barrier metal layer composed of a Ti layer and a TiN layer.

As shown in FIG. 1, on the fifth interlayer insulating film 45, an upper wire 50 connected to the fourth conductive plug 46 is formed. The upper wire 50 has a three-layered structure composed of a Ti layer, a TiN layer, and a W layer laminated to each other in this order. On the W layer, an antireflection film is formed.

According to the embodiment described above, after the fourth interlayer insulating film 30 consisting of silicon nitride having an internal tensile stress is formed, heat treatment is performed at 600° C. or higher when the dielectric film 36 for forming capacitors is formed. As shown in FIGS. 4 and 5, when the bottom surface of the wire 18 is not covered with the lower cover film consisting of silicon nitride, it is believed that the diffusion of elemental Ti occurs during heat treatment at 600° C. or higher. However, in the embodiment described above, even when heat treatment at 600° C. or higher is performed, the diffusion of elemental Ti is unlikely to occur. Accordingly, the generation of insulation defects between the wire 18 and the fourth conductive plug 46 can be prevented. In addition, when the heat treatment is performed at 530° C., the generation of insulation defects caused by the diffusion of elemental Ti substantially does not occur. As described above, when the heat treatment is performed at 600° C. or higher after a film having an internal tensile stress is formed, the structure described in the above embodiment has particular advantages.

Heretofore, the present invention has been described with reference to the embodiments; however, the present invention is not limited thereto. For example, it has been obvious to those who skilled in the art that various modification, improvements, combinations, and the like may be performed without departing from the scope of the present invention.

What is claimed is:

1. A semiconductor device comprising:
   a first insulating film provided on a principal surface of a semiconductor substrate;
   a wire formed on the first insulating film and comprising a first conductive layer consisting of titanium or titanium compound;
   a cover film consisting of silicon nitride and covering an upper surface, a bottom surface, and a side surface of the wire,
   wherein said wire is a layered structure and a bottom surface of said first conductive layer constitutes a bottom surface of said layered structure; and further comprising a tensile film disposed above the wire and having an internal tensile stress.

2. A semiconductor device according to claim 1, further comprising:
   a capacitor disposed on the tensile film;
   an active element disposed below the tensile film; and
   a capacitor connection member penetrating through the tensile film and connecting one electrode of the capacitor to the active element.

3. A semiconductor device according to claim 1, wherein the tensile film comprises silicon nitride.

4. A semiconductor device according to claim 3, wherein the tensile film has a thickness of 70 nm or more.

5. A semiconductor device according to claim 1, wherein the film having the internal tensile stress is not formed on a rear surface opposite to the principal surface of the semiconductor substrate.

6. A semiconductor device comprising
   a first insulating film provided on a principal surface of a semiconductor substrate;
   a wire formed on the first insulating film and comprising a first conductive layer consisting of titanium or titanium compound;
   a cover film consisting of silicon nitride and covering an upper surface, a bottom surface, and a side surface of the wire;
   a second insulating film disposed on the first insulating film so as to cover the upper surface of the wire, the cover film covering the upper surface of the wire being disposed between the wire and the second insulating film; and
   a conductive plug comprising a conductive material, which penetrates through the first insulating film and the second insulating film, and which passes by the wire.

7. A semiconductor device comprising:
   a first insulating film provided on a semiconductor substrate;
   a wire formed on the first insulating film and comprising a first conductive layer consisting of titanium or titanium compound; and
   a cover film consisting of silicon nitride and covering an upper surface, a bottom surface, and a side surface of the wire,
   wherein a thickness of a part of the cover film covering the bottom surface is at least 10 nm.

8. A semiconductor device according to claim 7, wherein the thickness of the cover film covering the bottom surface is at most 20 nm.

9. A semiconductor device comprising:
   a first insulating film provided on a principal surface of a semiconductor substrate;
   a wire formed on the fist insulating film and comprising a first conductive layer consisting of titanium or titanium compound;
   a cover film consisting of silicon nitride and covering an upper surface, a bottom surface, and a side surface of the wire; and
   a tensile film disposed above the wire and having an internal tensile stress.

10. A semiconductor device according to claim 9, further comprising:
    a capacitor disposed on the tensile film;
    an active element disposed below the tensile film; and
    a capacitor connection member penetrating through the tensile film and connecting one electrode of the capacitor to the active element.

11. A semiconductor device according to claim 9, wherein the tensile film comprises silicon nitride.

12. A semiconductor device according to claim 11, wherein the tensile film has a thickness of 70 nm or more.

13. A semiconductor device according to claim 9, wherein the film having the internal tensile stress is not formed on a rear surface opposite to the principal surface of the semiconductor substrate.

* * * * *